(12) United States Patent  
Bernstein et al.

(10) Patent No.: US 7,964,466 B2
(45) Date of Patent: Jun. 21, 2011

(54) FINFET TRANSISTOR AND CIRCUIT

(75) Inventors: Kerry Bernstein, Underhill, VT (US); Edward J. Nowak, Essex Junction, VT (US); BethAnn Rainey, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/762,427

(22) Filed: Apr. 19, 2010

(65) Prior Publication Data

US 2010/0203689 A1  Aug. 12, 2010

Related U.S. Application Data

(60) Division of application No. 11/969,339, filed on Jan. 4, 2008, now Pat. No. 7,777,276, and a continuation of application No. 11/458,250, filed on Jul. 18, 2006, now Pat. No. 7,368,355, and a division of application No. 10/709,076, filed on Apr. 12, 2004, now Pat. No. 7,115,920.

(51) Int. Cl.
*H01L 21/336* (2006.01)

(52) U.S. Cl. ............... 438/284; 257/E27.099

(58) Field of Classification Search .......... 438/284–286, 438/151, 197; 257/347, 404, E27.099
See application file for complete search history.

(56) References Cited

U.S. PATENT DOCUMENTS

| | | | |
|---|---|---|---|
| 5,396,089 A | 3/1995 | Wieck et al. | |
| 6,005,267 A | 12/1999 | Griffin et al. | |
| 6,121,666 A | 9/2000 | Burr | |
| 6,413,802 B1 | 7/2002 | Hu et al. | |
| 6,483,156 B1 | 11/2002 | Adkisson et al. | |
| 6,525,403 B2 * | 2/2003 | Inaba et al. | 257/618 |
| 6,662,350 B2 | 12/2003 | Fried et al. | |
| 6,794,718 B2 | 9/2004 | Nowak et al. | |
| 6,815,277 B2 * | 11/2004 | Fried et al. | 438/198 |
| 6,867,460 B1 | 3/2005 | Anderson et al. | |
| 6,967,351 B2 | 11/2005 | Fried et al. | |
| 7,265,417 B2 | 9/2007 | Adkisson et al. | |
| 2002/0163048 A1 | 11/2002 | Cebenko et al. | |
| 2002/0176286 A1 | 11/2002 | Bergemont et al. | |
| 2003/0038318 A1 | 2/2003 | Forbes | |
| 2003/0098488 A1 | 5/2003 | O'Keeffe et al. | |
| 2003/0102518 A1 | 6/2003 | Fried et al. | |
| 2003/0142550 A1 | 7/2003 | Kawahara et al. | |

(Continued)

FOREIGN PATENT DOCUMENTS

JP     1162362    6/1989

(Continued)

OTHER PUBLICATIONS

Near-Custom Book Image; IBM Technical Disclosure Bulletin; Oct. 1993; pp. 521-524.

(Continued)

*Primary Examiner* — Nathan W Ha
(74) *Attorney, Agent, or Firm* — Schmeiser, Olsen & Watts; Richard M. Kotulak

(57) ABSTRACT

A drive strength tunable FinFET, a method of drive strength tuning a FinFET, a drive strength ratio tuned FinFET circuit and a method of drive strength tuning a FinFET, wherein the FinFET has either at least one perpendicular and at least one angled fin or has at least one double-gated fin and one split-gated fin.

20 Claims, 4 Drawing Sheets

U.S. PATENT DOCUMENTS

| | | |
|---|---|---|
| 2004/0038464 A1 | 2/2004 | Fried et al. |
| 2005/0035415 A1 | 2/2005 | Yeo et al. |

FOREIGN PATENT DOCUMENTS

| | | |
|---|---|---|
| JP | 4372166 | 12/1992 |
| JP | 07-058620 | 3/1995 |
| JP | 11-220032 | 10/1999 |
| JP | 2001-077334 | 3/2001 |
| JP | 2001298194 | 10/2001 |
| JP | 2003298063 | 10/2003 |

OTHER PUBLICATIONS

Notice of Allowance (Mail Date Apr. 8, 2010) for U.S. Appl. No. 11/969,339, filed Jan. 4, 2008; Confirmation No. 1639.

* cited by examiner the first to the second end of the second fin, the first end of the second fin in contact with the source and the second end of the second fin in contact with the drain; aligning the second longitudinal axis to a plane rotated away from the crystal plane; and providing a conductive gate in contact with a gate dielectric formed on the first and second sidewalls of the first fin and on the first and second sidewalls of the second fin.

FINFET TRANSISTOR AND CIRCUIT

This application is a division of copending U.S. patent application Ser. No. 11/969,339 filed Jan. 4, 2008 which is continuation of U.S. patent application Ser. No. 11/458,250 filed on Jul. 18, 2006, now U.S. Pat. No. 7,368,355 issued May 6, 2008 which is a divisional application of U.S. patent application Ser. No. 10/709,076 filed on Apr. 12, 2004, now U.S. Pat. No. 7,115,920 issued on Oct. 3, 2006.

FIELD OF THE INVENTION

The present invention relates to the field of FinFET (fin field effect transistors); more specifically, it relates to FinFETs with tuned drive strength, methods tuning the drive strength of FinFETs and circuits utilizing FinFETs with tuned drive strengths.

BACKGROUND OF THE INVENTION

Integrated circuit technology and complementary metaloxide-silicon (CMOS) technology is ever pushed in the direction of higher performance and hence smaller transistor dimensions. Below about 65 nm FinFET technology is emerging as the technology to carry forward the pursuit of high performance circuits. At the high performance levels utilizing sub-65 nm dimensions, very fine tuning the drive strengths of transistors in integrated circuits becomes critical, however, no method presently exists for doing this for circuits made up of FinFETs because of the quantized nature of their structures. Thus, there is a need for fine tunable drive strength FinFETs and methods of fine-tuning the drive strength of FinFETs.

SUMMARY OF THE INVENTION

A first aspect of the present invention is an electronic device, comprising: a source and a drain; a single-crystal first fin having first and second opposing ends and first and second opposing sidewalls and extending along a first longitudinal axis from the first to the second end of the first fin, the first end of the first fin in contact with the source and the second end of the first fin in contact with the drain, the first longitudinal axis aligned to a crystal plane; a single-crystal second fin having first and second opposing ends and first and second opposing sidewalls and extending along a second longitudinal axis from the first to the second end of the second fin, the first end of the second fin in contact with the source and the second end of the second fin in contact with the drain, the second longitudinal axis aligned in a plane rotated away from the crystal plane; and a single conductive gate in contact with a gate dielectric formed on the first and second sidewalls of the first fin and on the first and second sidewalls of the second fin.

A second aspect of the present invention is a method for tuning the drive strength of an electronic device, comprising: forming a source and a drain in a single-crystal material; forming a single-crystal first fin from the single-crystal material, the first fin having first and second opposing ends and first and second opposing sidewalls and extending along a first longitudinal axis from the first to the second end of the first fin, the first end of the first fin in contact with the source and the second end of the first fin in contact with the drain; aligning the first longitudinal axis to a crystal-plane of the single-crystal material; forming a single-crystal second fin from the single-crystal material, the second fin having first and second opposing ends and first and second opposing sidewalls and extending along a second longitudinal axis A third aspect of the present invention an integrated circuit, comprising: a first transistor comprising: a first source and a first drain; a single-crystal first fin having first and second opposing ends and first and second opposing sidewalls and extending along a first longitudinal axis from the first to the second end of the first fin, the first end of the first fin in contact with the first source and the second end of the first fin in contact with the first drain, the first longitudinal axis aligned to a crystal plane; a single-crystal second fin having first and second opposing ends and first and second opposing sidewalls and extending along a second longitudinal axis from the first to the second end of the second fin, the first end of the second fin in contact with the first source and the second end of the second fin in contact with the first drain, the second longitudinal axis aligned in a plane rotated away from the crystal plane; and a first conductive gate in contact with a gate dielectric formed on the first and second sidewalls of the first fin and on the first and second sidewalls of the second fin; and a second transistor comprising: a second source and a second drain; a single-crystal third fin having first and second opposing ends and first and second opposing sidewalls and extending along a third longitudinal axis from the first to the second end of the third fin, the first end of the third fin in contact with the second source and the second end of the first fin in contact with the second drain, the third longitudinal axis aligned to the crystal plane; and a second conductive gate in contact with a gate dielectric formed on the first and second sidewalls of the third fin and on the first and second sidewalls of the third fin.

A fourth aspect of the present invention is a method of tuning the drive strength ratio between a first transistor and a second transistor in an integrated circuit, comprising: providing the first transistor, the first transistor comprising: a first source and a first drain; a single-crystal first fin having first and second opposing ends and first and second opposing sidewalls and extending along a first longitudinal axis from the first to the second end of the first fin, the first end of the first fin in contact with the first source and the second end of the first fin in contact with the first drain, the first longitudinal axis aligned to a crystal plane; a single-crystal second fin having first and second opposing ends and first and second opposing sidewalls and extending along a second longitudinal axis from the first to the second end of the second fin, the first end of the second fin in contact with the first source and the second end of the second fin in contact with the first drain, the second longitudinal axis aligned in a plane rotated away from the crystal plane; and a first conductive gate in contact with a gate dielectric formed on the first and second sidewalls of the first fin and on the first and second sidewalls of the second fin; and providing the second transistor, the second transistor comprising: a second source and a second drain; a single-crystal third fin having first and second opposing ends and first and second opposing sidewalls and extending along a third longitudinal axis from the first to the second end of the third fin, the first end of the third fin in contact with the second source and the second end of the first fin in contact with the second drain, the third longitudinal axis aligned to the crystal plane; and a second conductive gate in contact with a gate dielectric formed on the first and second sidewalls of the third fin and on the first and second sidewalls of the third fin.

A fifth aspect of the present invention is an electronic device, comprising: a source and a drain; a single-crystal first fin having first and second opposing ends and first and second opposing sidewalls, the first end of the first fin in contact with the source and the second end of the first fin in contact with the drain, the first longitudinal axis aligned to a crystal plane; a single-crystal second fin having first and second opposing ends and first and second opposing sidewalls, the first end of the second fin in contact with the source and the second end of the second fin in contact with the drain; a first conductive gate in contact with a gate dielectric formed on the first and second sidewalls of the first fin and on the first sidewall of the second fin; and a second conductive gate in contact with a gate dielectric formed on the second sidewall of the second fin.

A sixth aspect of the present invention is a method for tuning the drive strength of an electronic device, comprising: providing a source and a drain, providing a single-crystal first fin having first and second opposing ends and first and second opposing sidewalls, the first end of the first fin in contact with the source and the second end of the first fin in contact with the drain; providing a single-crystal second fin having first and second opposing ends and first and second opposing sidewalls, the first end of the second fin in contact with the source and the second end of the second fin in contact with the drain; providing a first conductive gate in contact with a gate dielectric formed on the first and second sidewalls of the first fin and on the first sidewall of the second fin; providing a second conductive gate in contact with a gate dielectric formed on the second sidewall of the second fin; and connecting the first gate to a first voltage source at a first voltage level and connecting the second gate a second voltage source at a second voltage level, the first and second voltage levels being different.

A seventh aspect of the present invention is an integrated circuit, comprising: a first transistor comprising: a first source and a first drain; a single-crystal first fin having first and second opposing ends and first and second opposing sidewalls, the first end of the first fin in contact with the first source and the second end of the first fin in contact with the first drain; a single-crystal second fin having first and second opposing ends and first and second opposing sidewalls, the first end of the second fin in contact with the first source and the second end of the second fin in contact with the first drain; a first conductive gate in contact with a gate dielectric formed on the first and second sidewalls of the first fin and on the first sidewall of the second fin; and a second conductive gate in contact with a gate dielectric formed on the second sidewall of the second fin; and a second transistor comprising: a second source and a second drain; a single-crystal third fin having first and second opposing ends and first and second opposing sidewalls, the first end of the third fin in contact with the second source and the second end of the third fin in contact with the second drain; and a third conductive gate in contact with a gate dielectric formed on the first and second sidewalls of the third fin and on the first and second sidewall of the third fin.

An eighth aspect of the present invention is a method of tuning the drive strength ratio between a first transistor and a second transistor in an integrated circuit, comprising providing the first transistor, the first transistor comprising: a first source and a first drain; a single-crystal first fin having first and second opposing ends and first and second opposing sidewalls, the first end of the first fin in contact with the first source and the second end of the first fin in contact with the first drain; a single-crystal second fin having first and second opposing ends and first and second opposing sidewalls, the first end of the second fin in contact with the first source and the second end of the second fin in contact with the first drain; a first conductive gate in contact with a gate dielectric formed on the first and second sidewalls of the first fin and on the first sidewall of the second fin; and a second conductive gate in contact with a gate dielectric formed on the second sidewall of the second fin; providing the second transistor, the second transistor comprising: a second source and a second drain; a single-crystal third fin having first and second opposing ends and first and second opposing sidewalls, the first end of the third fin in contact with the second source and the second end of the third fin in contact with the second drain; and a third conductive gate in contact with a gate dielectric formed on the first and second sidewalls of the third fin and on the first and second sidewall of the third fin; and connecting the first gate to a first voltage source at a first voltage level and connecting the second gate to a second voltage source at a second voltage level, the first and second voltage levels being different.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

In crystalline solids, the atoms, which make up the solid, are spatially arranged in a periodic fashion called a lattice. A crystal lattice always contains a volume, which is representative of the entire lattice and is regularly repeated throughout the crystal. In describing crystalline semiconductor materials in the present disclosure, the following conventions are used.

The directions in a lattice are expressed as a set of three integers with the same relationship as the components of a vector in that direction. For example, in cubic lattices, such as silicon, which have a diamond crystal lattice, a body diagonal exists along the [111] direction with the [ ] brackets denoting a specific direction. Many directions in a crystal lattice are equivalent by a symmetry transformation, depending upon the arbitrary choice of orientation axes. For example, a crystal directions in the cubic lattice [100], [010] and [001] are all crystallographically equivalent. A direction and all its equivalent directions are denoted by < > brackets. Thus, the designation of the <100> direction includes the equivalent [100], [010] and [001] positive directions as well as the equivalent negative directions [−100], [0-10] and [00-1].

Planes in a crystal may also be identified with a set of three integers. They are used to define a set of parallel planes and each set of integers enclosed in ( ) parentheses identifies a specific plane. For example the proper designation for a plane perpendicular to the [100] direction is (100). Thus, if either a direction or a plane of a cubic lattice is known, its perpendicular counterpart may be quickly determined without calculation. Many planes in a crystal lattice are equivalent by a symmetry transformation, depending upon the arbitrary choice of orientation axes. For example, the (100), (010) and (001) planes are all crystallographically equivalent. A plane and all its equivalent planes are denoted by { } parentheses. Thus, the designation of the {100} plane includes the equivalent (100), (010) and (001) positive planes as well as the equivalent planes (−100), (0-10) and (00-1).

Figure 1:
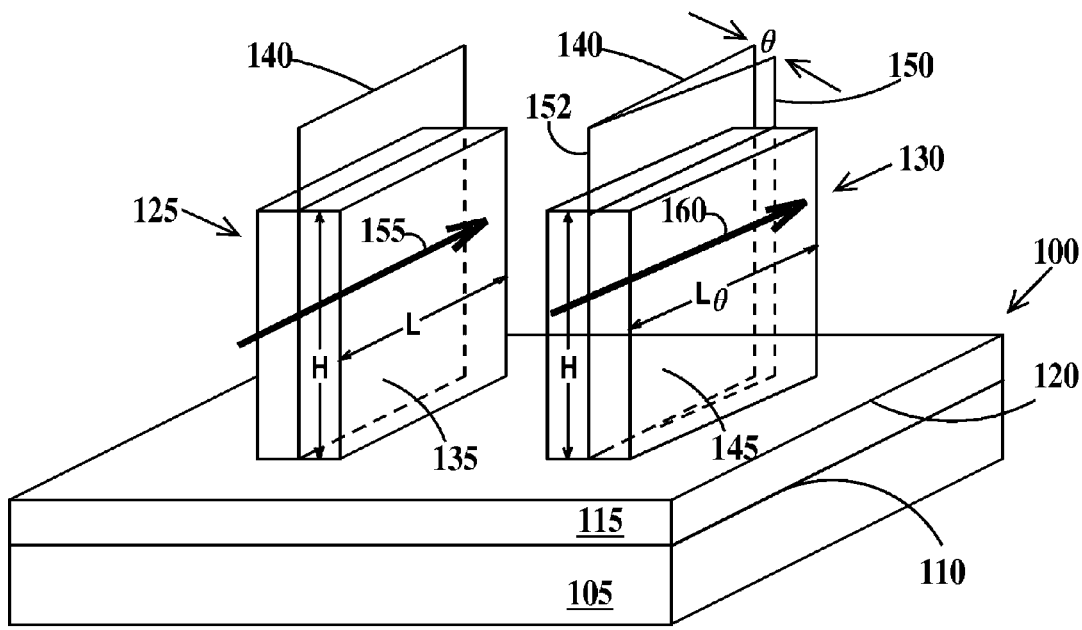
FIG. 1 is an isometric view of representative fin portions of various FinFETs according to the various embodiments of the present invention.

FIG. 1 is an isometric view of representative fin portions of various FinFETs according to the various embodiments of the present invention. In FIG. 1, a substrate 100 includes a support layer 105 having a top surface 110, an isolation layer 115 having a top surface 120, the isolation layer formed on top surface 110 of support layer 105. Isolation layer 115 may comprise a buried oxide layer (BOX), or may comprise a doped semiconductor region. Fins 125 and 130 are formed from a crystalline semiconductor material formed on top surface 120 of buried isolation 115. Fins 125 and 130 may be composed of any appropriate semiconductor material, including, but not limited to: Si, Ge, GaP, InAs, InP, SiGe, GaAs, or other group MN compounds. Fin 125 has parallel sidewalls 135 (only one sidewall is visible in FIG. 1) parallel to a crystal-plane 140. Fin 130 has parallel sidewalls 145 (only one sidewall is visible in FIG. 1) parallel to a crystal-plane 150. Plane 150 is offset from crystal-plane 140 by an angle θ with respect to a common axis 152. In one example, fins 125 and 130, when used in an NFET FinFET (hereafter N FinFET) comprise single-crystal silicon and crystal-plane 140 is a {100} crystal-plane and when used in a PFET FinFET (hereafter P FinFET), comprise single-crystal silicon and crystal-plane 140 is a {110} crystal-plane. In one example, when crystal plane 140 is a {100} crystal-plane, θ defines a rotation of fin 130 into the {110} crystal-plane and when crystal plane 140 is a {110} crystal-plane, θ defines a rotation of fin 140 into the {100} crystal-plane.

Fin 125 has a physical length L in a direction parallel to top surface 120 of buried isolation layer 115 within plane 140 and a physical height H in a direction perpendicular to the direction of physical length L. Fin 130 has a physical length $L_\theta$ in a direction parallel to top surface 120 of buried isolation layer 115 within a plane 150 (which is offset from plane 140 by angle θ) and a physical height H in a direction perpendicular to the direction of physical length $L_\theta$. Note, in a FinFET, the physical height of the fin determines the electrical channel width of the transistor. In a single gate FinFET (a gate formed on one side of the fin) the physical height H determines the electrical channel width W. In a double-gate FinFET the channel width is twice the height because there is a gate on either side of the fin, W is a function of 2H. (See definition of a double-gate FinFET infra). The physical length of a FinFET fin defines the channel length of FinFET the same as for conventional FETs, thus the designation L or $L_\theta$ may be understood to also mean channel length hereafter.

When fins 125 and 130 are incorporated into FinFETs, inversion carrier flow direction is in directions 155 and 160 respectively. Direction 155 is parallel to sidewalls 135 and direction 160 is parallel to sidewalls 145. It is well known, that inversion carrier flow is affected by the crystal orientation of the fin of a FinFET. For N FinFETs, maximum inversion carrier (electron) mobility is along the {100} crystal-plane and for P FinFETs the maximum inversion carrier (hole) mobility is along the {110} crystal-plane. This is reflected in the transconductance (Gm) of a FinFET as illustrated in FIG. 2 and discussed infra.

Figure 2:
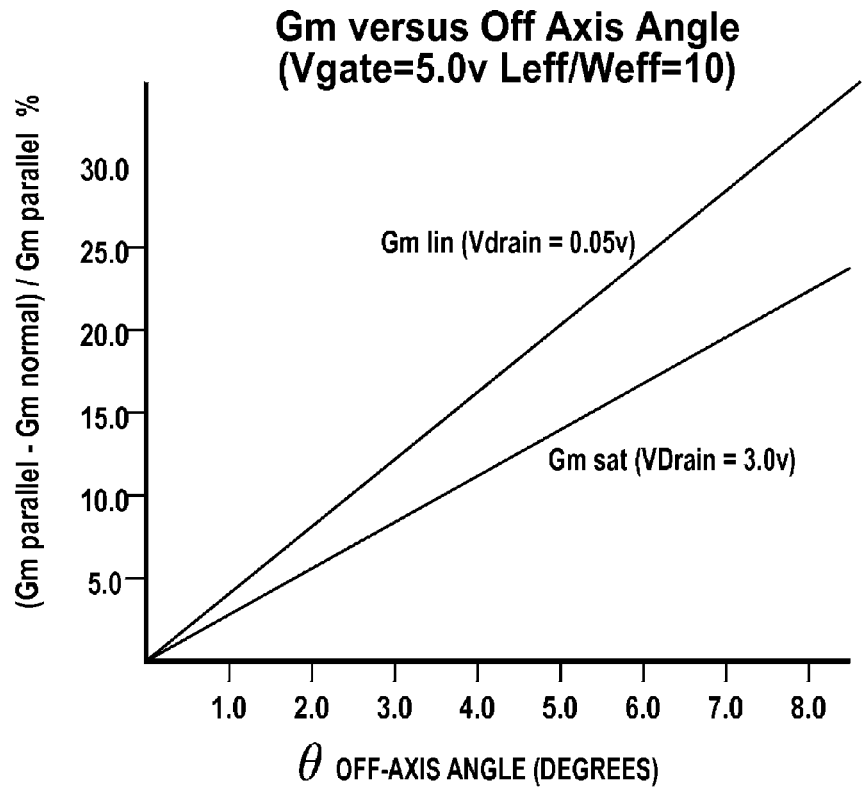
FIG. 2 is a plot of the reduction in transconductance in the linear and saturation region of a FinFET vs. off angle axis θ.

FIG. 2 is a plot of the reduction in transconductance in the linear and saturation region of a FinFET vs. off angle axis θ. Transconductance (Gm) is the ratio of output current to input voltage and is the measure of the gain of a FET. In FIG. 2 both the transconductance when the transistor is operating in the linear region Gm lin (upper curve) and the transconductance when the transistor is operating in the saturation region Gm sat (lower curve) are only equal at θ (offset from the maximum mobility axis)=0. Gm sat progressively fails off from Gm lin as θ increases.

The curves of FIG. 2 may be explained, in at least part, by the following: The mobility of the electrons (inversion carriers) in the channels of NFETs is nearly at its highest in the {100} plane and significantly lower in the {110} plane. The electron-mobility in the {110} plane is about half that in the {100} plane. The mobility of holes (inversion carriers) in the channels of PFETs is highest in the {110} plane and significantly lower in the {100} plane. The hole-mobility in the {100} plane is about less than half that in the {110} plane. The {100} and {110} planes are orientated to each other at an angle of 45° when formed by vertical surfaces cut from a {100}-surfaced wafer.

Figure 3A:
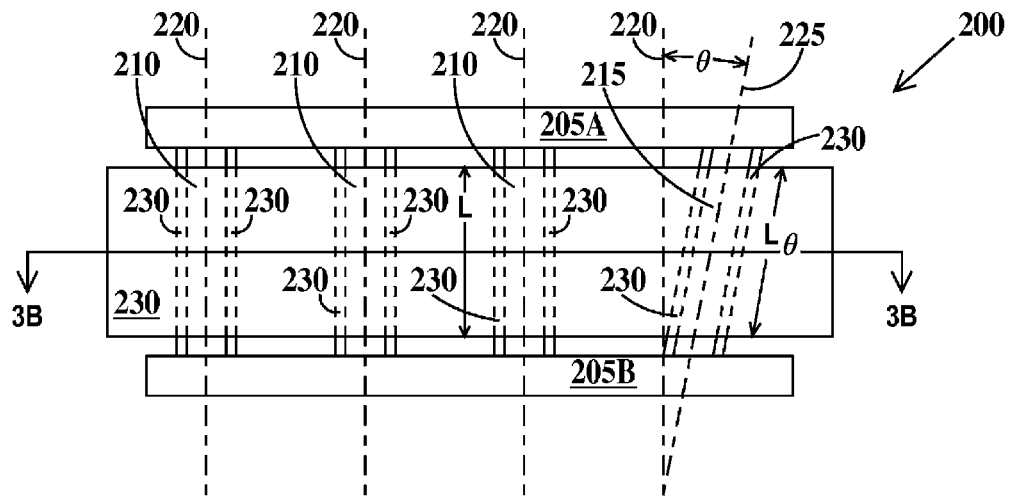
FIG. 3A is a top view and FIG. 3B is a side view through line 3B-3B of FIG. 3A of a FinFET transistor according to the first embodiment of the present invention.
Figure 3B:
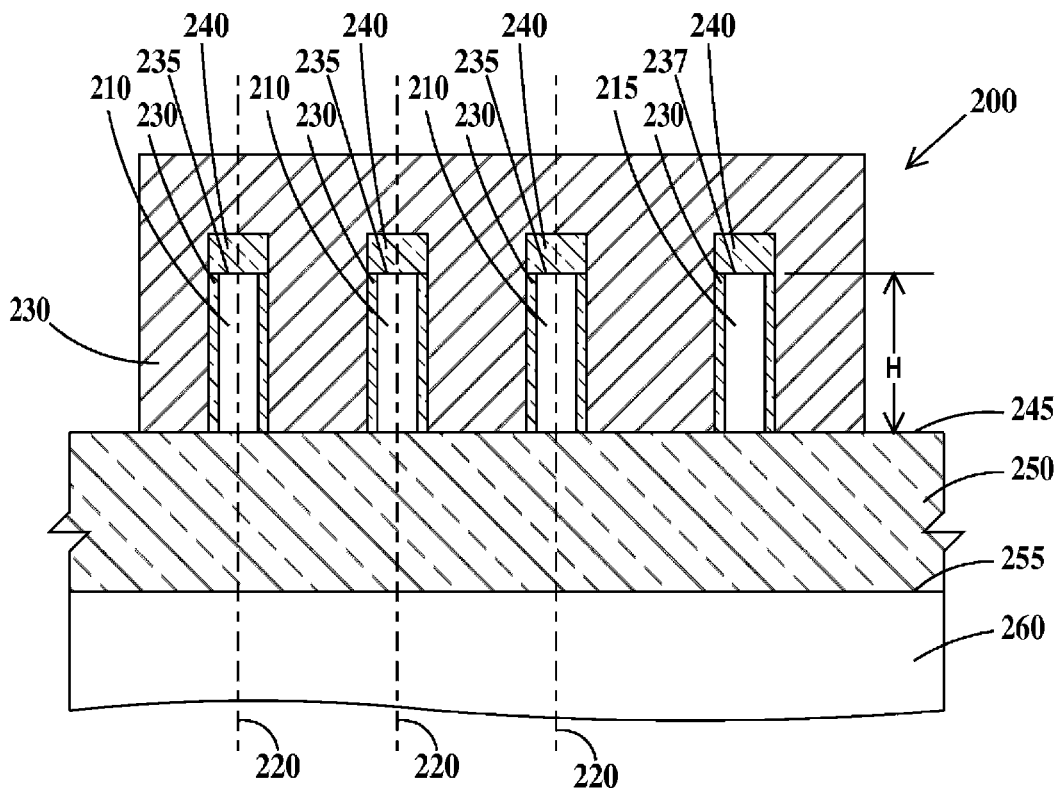

FIG. 3A is a top view and FIG. 3B is a side view through line 3B-3B of FIG. 3A of a FinFET transistor according to the first embodiment of the present invention. In FIG. 3A, FinFET 200 includes parallel source/drains 205A and 205B in physical and electrical contact with opposite ends of single-crystal perpendicular fins 210 and an angled single-crystal fin 215. Perpendicular fins 210 are longitudinally aligned with a plane 220, while angled fin 215 is longitudinally aligned with a plane 225, which is offset (by rotation along a axis common to both planes 210 and 225 as illustrated in FIG. 1 and described supra) from crystal plane 220 by an angle θ. The angle θ also represents a rotation from a higher inversion carrier mobility direction to a lower major carrier mobility direction. Fins 210 are perpendicular to source/drains 205A and 205B. A common gate 230 is formed over perpendicular fins 210 and angled fin 215 and is electrically isolated from the fins by gate dielectric 235 formed on opposite sides of each fin. Perpendicular fins 210 have a channel length L and angled fin 215 has a channel length $L_\theta$ where $L_\theta = L/\cos\theta$. Perpendicular fins 210 and angled fin 215 have the same height H (see FIG. 3B).

Turning to FIG. 3B, it can be seen that perpendicular fins 210 and angled fin 215 have a height H and top surfaces 235 of perpendicular fins 210 and top surface 237 of angled fin 215 are electrically isolated from gate 230 by dielectric caps 240. Note, it is possible to replace dielectric caps 240 with gate dielectric 230. Perpendicular fins 210 and angled fin 215 are formed on a top surface 245 of an insulating layer 250, which is formed on a top surface 255 of a substrate 260.

In a first example, FinFET 200 is an N FinFET, source/drains 205A and 205B are doped N-type, perpendicular fins 210 and angled fin 215 comprises comprise P-doped, lightly N-doped or intrinsic mono-crystalline silicon, plane 220 is a {100} crystal-plane and θ is an angle of rotation into the {110} crystal-plane. In a second example, FinFET 200 is a P FinFET, source/drains 205A and 205B are doped P-type, perpendicular fins 210 and angled fin 215 comprise N-doped, or lightly P-doped or intrinsic mono-crystalline silicon, plane 220 is a {110} crystal-plane and θ is an angle of rotation into the {100} crystal-plane.

Lightly doped N or P monocrystalline silicon is defined has having a doping level that will not prevent formation of a inversion layer in the channel region under the gate of the fin between the source and drains of a FinFET with a normal operating voltage applied to the gate. In one example, lightly doped silicon has an N or P dopant species concentration of about $10^{15}$ atm/cm$^3$ or less.

The drive strength of a transistor is defined as the measure of the amount of current the transistor can supply. The ratio of drive strengths between PFETS and NFETS in integrated circuits is an important consideration as will be described infra. The relative drive strength of FinFET 200 is given in equation 1.

$$\beta \approx (W/L)(3+(\cos\theta)(1-0.9(|\theta/45°|))), |\theta|<45° \quad (1)$$

where:
$\beta$=the relative drive strength of the transistor;
W=the channel width of each fin;
L=the length of the three perpendicular fins 205; and
$\theta$=the angle between the three perpendicular fins and the angled fin.

While three perpendicular fins 210 and one angled fin 215 are illustrated in FIGS. 3A and 3B, there may be any number from one upward of perpendicular fins 210 and any number from one upward of angled fins 215. There must be at least one perpendicular fin 210 and one angled fin 215. In the general case, of N perpendicular fins 210 and M angled fins 215 the relative drive strength of the general case tunable drive strength FinFET is given in equation 2.

$$\beta \approx (W/L)(N+M\cos(\theta)(1-0.9(|\theta/45°|))), |\theta|<45° \quad (2)$$

where:
$\beta$=the relative drive strength of the transistor;
N=the number of perpendicular fins;
M=the number of angled fins;
W=the channel width of each fin;
L=the length of the perpendicular fins; and
$\theta$=the angle between the perpendicular fins and the angled fin, in degrees.

In a FinFET using only perpendicular fins the granularity of control of drive strength is related to the number of fins and is very coarse unless there are a prohibitive number of fins. The drive strength of a FinFET incorporating at least one perpendicular fin and one angled fin can be adjusted by not only the total number of fins of each type, but by the angle of the angled fin(s) relative to the perpendicular fin. This degree of tuning is only limited by the incremental control of the process in imaging incremental changes in fin angle ($\theta$) and the minimum reduction (about 0.5) at a corresponding maximum angle (about 45°) in carrier mobility that can be realized. Increments below about 0.5 can be obtained with multiple angled fins. See Table I.

TABLE I

| Drive Strength (Multiples of W/L) | Number Perpendicular Fins | Number of Angled Fins | Angle Between Perpendicular and Angled Fins |
|---|---|---|---|
| 3 | 3 | 0 | N/A |
| 4 | 4 | 0 | N/A |
| 3.8 | 3 | 1 | ~10° |
| 3.2 | 2 | 2 | ~10° |

Figure 4A:
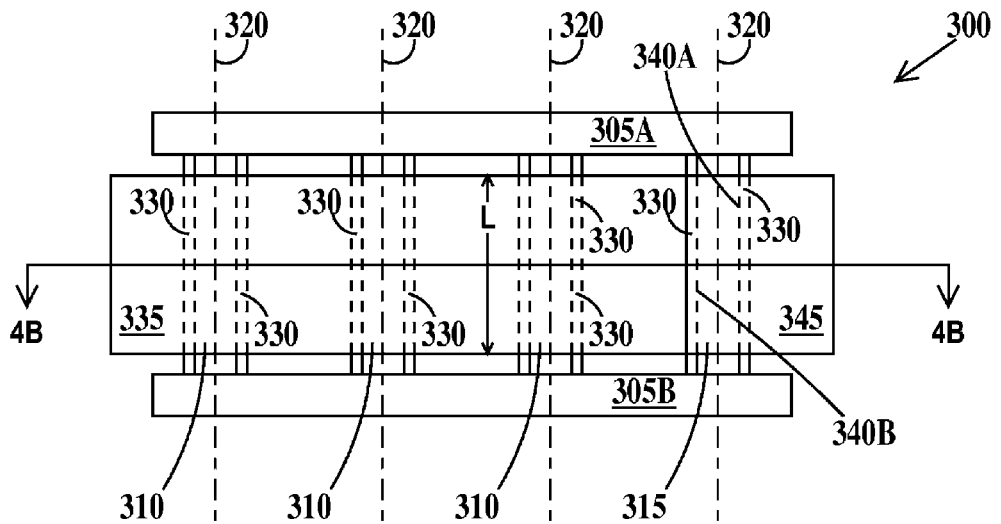
FIG. 4A is a top view and FIG. 4B is a side view through line 4B-4B of FIG. 4A of a FinFET transistor according to a second embodiment of the present invention.
Figure 4B:
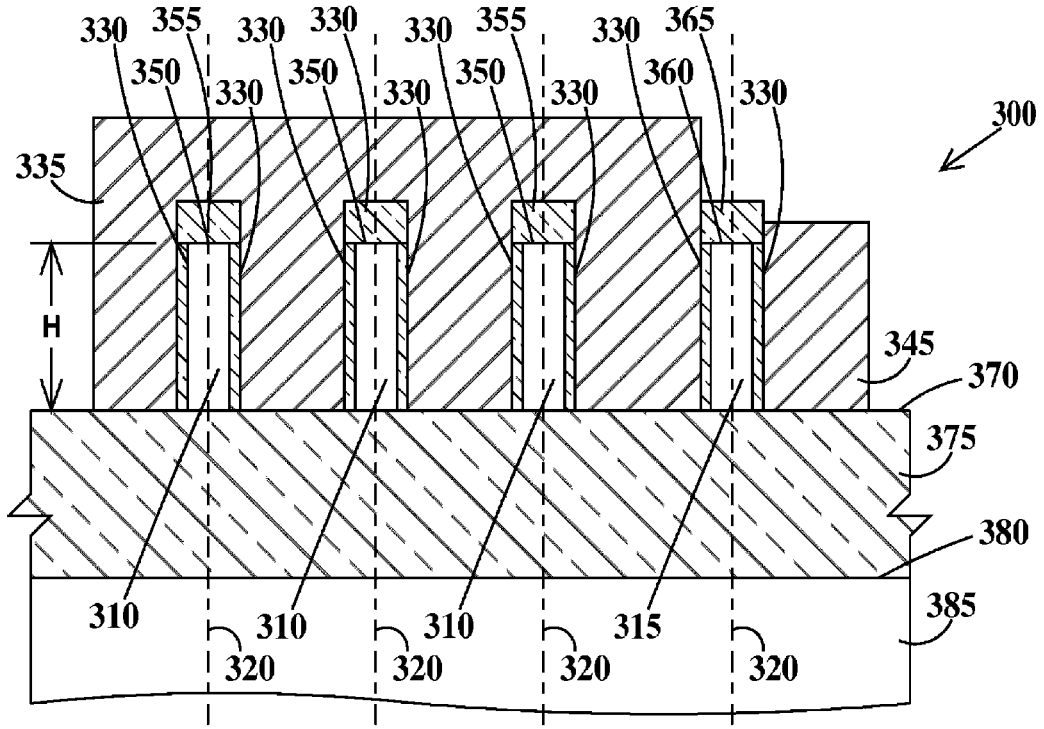

Before describing the second embodiment of the present invention the terms double-gate and split-gate need to be defined. A double-gate transistor is defined as a transistor having two dependent gates, in the case of a FinFET, the gates are located on opposing sidewalls of the fin and electrically connected. They may be integral to one another as well, as is illustrated in FIGS. 4A and 4B. A split-gate transistor is defined as a transistor having two independent gates, in the case of a FinFET, the gates are located on opposing sidewalls of the fin and are electrically isolated from one another.

FIG. 4A is a top view and FIG. 4B is a side view through line 4B-4B of FIG. 4A of a FinFET transistor according to a second embodiment of the present invention. In FIG. 4A, FinFET 300 includes parallel source/drains 305A and 305B in physical and electrical contact with opposite ends of single-crystal double-gate fins 310 and a single-crystal split-gate fin 315. Double-gate fins 310 and split-gate fin 315 are longitudinally aligned with mutually parallel planes 320. Planes 320 may be higher inversion carrier mobility planes, for example {100} for N FinFETs and {110} for P FinFETs. Double-gate fins 310 and split-gate fin 315 are perpendicular to source/drains 305A and 305B. A gate dielectric 330 is formed on sidewalls of double-gate fins 310 and split-gate fin 315. A first gate 335 is formed over double-gate fins 310 and contacts gate dielectric 330 on formed on both sidewalls of each double-gate fin 315. First gate 335 also contacts gate dielectric 330 formed on a first side 340A of split-gate fin 315. A second gate 345 contacts gate dielectric 330 formed on a second side of split-gate fin 315. Double-gate fins 305A and split-gate fin 315 have the same channel length L and have the same height H (see FIG. 4B).

Turning to FIG. 4B, it can be seen that double-gate fins 310 and split-gate fin 315 have a height H and top surfaces 350 of double-gate fins 310 are electrically isolated from first gate 335 by dielectric caps 355. A dielectric cap 365 is formed on a top surface 360 of split-gate fin 315. Note, it is possible to replace dielectric caps 355 and 365 with gate dielectric 330. Double-gate fins 310 and split-gate fin 315 are formed on a top surface 370 of an insulating layer 375, which is formed on a top surface 380 of a substrate 385.

In a first example, FinFET 300 is an N FinFET, source/drains 305A and 305B are doped N-type, double-gate fins 310 and split-gate fin 315 comprise P-doped, lightly N-doped or intrinsic mono-crystalline silicon, and plane 320 has {100} orientation. In a second example, FinFET 300 is a P FinFET, source/drains 305A and 3105B are doped P-type, double-gate fins 310 and split-gate fin 315 comprise N-doped, lightly P-doped, or intrinsic mono-crystalline silicon, and plane 320 is a {110} crystal-plane The drive strength contribution of split-gate fin 315 with zero voltage on second gate 345 is about half that of a double-gate fin 310. The drive strength contribution of split-gate fin 315 can be varied between about zero to the same as that of double-gate fins 310 by varying the voltage applied to second gate 345. By increasing the voltage (magnitude) from zero toward the voltage (magnitude) applied to first gate 335 the drive strength of split-gate fin 315 can be increased. By biasing second gate 345 more negative than the source for an N FinFET or more positive than the source for a P FinFET, the drive strength of split-gate fin 315 can be decreased.

While three double-gate fins 310 and one split-gate fin 315 are illustrated in FIGS. 4A and 4B, there may be any number from one upward of double-gate fins 310 and any number from one upward of split-gate fins 315. For example, the two outermost fins of a set of fins may very easily be fabricated as split-gate fins. Inner fins may be formed as split-gate fins, but more complicated gate shape layouts (when viewed in top or plan view) are required.

Many high performance CMOS circuits require a precise ratio of drive strengths between specific PFETs and specific NFETs in order to achieve a balance between noise immunity, performance and power. The drive strength ratio (also called the Beta-ratio) is the quotient given by the effective channel width-to-length (W/L) ratio of the PFET divided by the effective channel width-to-length (W/L) ratio of the NFET. The FinFET transistors described supra, allow fine-tuning of the Beta-ratio.

Figure 5:
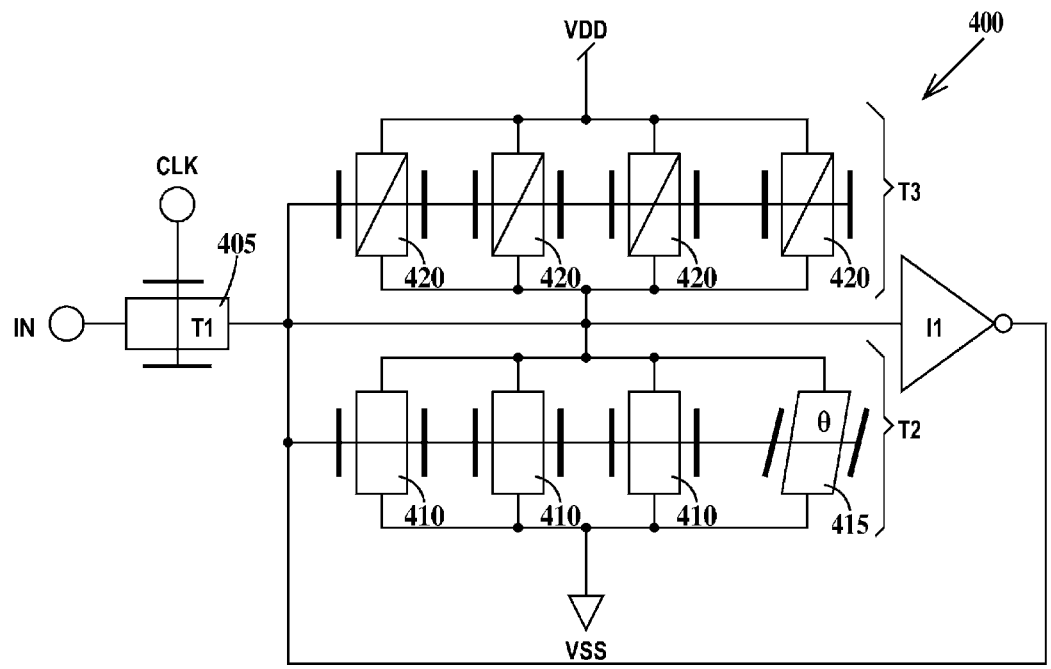
FIG. 5 is an exemplary circuit utilizing a FinFET whose drive strength has been tuned according to the first embodiment of the present invention.
Figure 6:
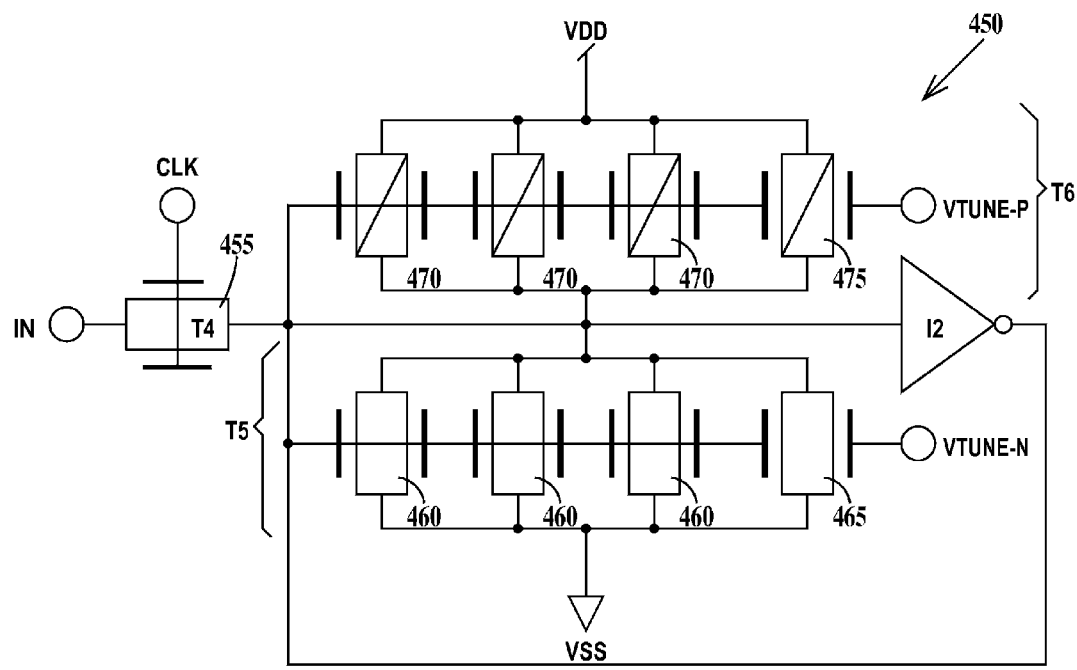
FIG. 6 is an exemplary circuit utilizing a FinFET whose drive strength has been tuned according to the second embodiment of the present invention.

In FIGS. 5 and 6 transistors bodies (exclusive of the source/drains) are formed from one of more mono-crystalline fins, thus in the description of FIGS. 5 and 6, the term fin can be read as body as well.

FIG. 5 is an exemplary circuit utilizing a FinFET whose drive strength has been tuned according to the first embodiment of the present invention. In FIG. 5, a latch circuit 400 includes transistors T1, T2, T3 and an inverter I1. Transistors T1, T2 and T3 are double-gate FinFET transistors. Transistor T1 is illustrated as an N FinFET having a one fin 405. Transistor T2 is illustrated as an N FinFET having three perpendicular fins 410 and one angle fin 415 and a common gate. Angled fin 410 is also designated with the symbol θ. Transistor T3 is illustrated as a P FinFET having four perpendicular fins 420 and a common gate. The source of transistor T1 is coupled to an input signal, the gate of transistor T1 is coupled to a CLK signal and the drain of transistor T1 is coupled to the gates of transistors T2 and T3, the drains of transistors T2 and T3 and the input and output of inverter I1. The source of transistor T3 is coupled to VDD and the source of transistor T2 is coupled to VSS.

The drive strength ratio (also known as the beta ratio), $\beta_{T3}/\beta_{T2}$ of latch circuit 400 can be tuned (in the sense of set during manufacture of the circuit) by rotation of fin 415 of transistor T2 in a direction relative to the direction of fins 410 that reduces the mobility of the inversion carriers in fin 415 relative to the mobility of the inversion carriers in fins 410.

It should be noted, that while only transistor T2 is illustrated in FIG. 5 and described as being drive strength tunable, either or both of transistors T2 or T3 may be drive strength tunable according to the first embodiment of the present invention.

FIG. 6 is an exemplary circuit utilizing a FinFET whose drive strength has been tuned according to the second embodiment of the present invention. In FIG. 6, a latch circuit 450 includes transistors T4, T5, T6 and an inverter I2. Transistor T4 is a double-gate FinFET transistor. Transistors T5 and T6 are mixed gate FinFET transistors having multiple double-gate fins and one split-gate fin each. Transistor T4 is illustrated as an N FinFET having one double-gate fin 455. Transistor T5 is illustrated as an N FinFET having three fins 460 and one fin 465, a first gate common to all gate regions of fins 460 and a first gate region of fin 465, and a second gate connected only to a second gate region of fin 465. Transistor T6 is illustrated as a P FinFET having three fins 470 and one fin 475, a first gate common to all gate regions of fins 470 and a first gate region of fin 475, and a second gate connected only to a second gate region of fin 475. The source of transistor T4 is coupled to an input signal, the gate of transistor T4 is coupled to a CLK signal and the drain of transistor T4 is coupled to the first gates of transistors T5 and T6, the drains of transistors T5 and T6 and the input and output of inverter I2. The second gate of transistor T5 is coupled to a voltage source VTUNE-N and the second gate of transistor T6 is coupled to a voltage source VTUNE-P. The source of transistor T6 is coupled to VDD and the source of transistor T5 is coupled to VSS.

The drive strength ratio, $\beta_{T6}/\beta_{T5}$ of latch circuit 450 can be dynamically tuned (in the sense of set during operation) by adjustment of VTUNE-N, VTUNE-P or both VTUNE-N and VTUNE-P. Further, the drive strength ratio $\beta_{T6}/\beta_{T5}$ of latch circuit 450 may be permanently fixed by programming fuses to set the voltage levels of VTUNE-N and VTUNE=P.

It should be noted, that while both transistors T5 and T6 are illustrated as having tunable drive strength transistors, only one of transistors T5 or T6 need be drive strength tunable according to the second embodiment of the present invention.

Other circuits that may be drive strength ratio "tuned" by the methods of the first and second embodiments of the present invention include, but are not limited to static random access memory (SRAM) circuits, phase locked loop (PLL) circuits, dynamic domino circuits, and imbalanced static combinational CMOS logic circuits.

Thus, the present invention provides fine-tunable drive strength FinFETs and methods for fine-tuning the drive strength of FinFETs.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, in the first embodiment of the present invention, the entire angled fin need not be set at an angle relative to the perpendicular fin, but may be bent so a portion of the angled fin is parallel to the perpendicular fin and a portion angled relative to the perpendicular fin. Therefore, it is intended that the following claims cover all such modifications and changes as fall within the true spirit and scope of the invention.

What is claimed is:

1. A method for tuning the drive strength of an electronic device, comprising:

forming a source and a drain in a single-crystal material;

forming a single-crystal first fin from said single-crystal material, said first fin having first and second opposing ends and first and second opposing sidewalls and extending along a first longitudinal axis from said first to said second end of said first fin, said first end of said first fin in contact with said source and said second end of said first fin in contact with said drain;

aligning said first longitudinal axis to a crystal-plane of said single-crystal material;

forming a single-crystal second fin from said single-crystal material, said second fin having first and second opposing ends and first and second opposing sidewalls and extending along a second longitudinal axis from said first to said second end of said second fin, said first end of said second fin in contact with said source and said second end of said second fin in contact with said drain;

aligning said second longitudinal axis to a plane rotated away from said crystal plane; and forming a single conductive gate in contact with a gate dielectric formed on said first and second sidewalls of said first fin and on said first and second sidewalls of said second fin.

2. The method of claim 1, wherein said crystal plane has orthogonal first and second axes, said plane has orthogonal first and second axes and said first axis of said crystal plane and said first axis of said plane are mutually parallel.

3. The method of claim 1, wherein said source and said drain are doped N-type, said first fin and said second fin independently comprise P-doped, lightly N-doped or intrinsic mono-crystalline silicon, said crystal plane is a {100} crystal-plane and said plane is rotated toward a {110} crystal-plane.

4. The method of claim 1, wherein said source and said drain are doped P-type, said first fin and said second fin independently comprise N-doped, lightly P-doped or intrinsic mono-crystalline silicon, said crystal-plane is a {110} crystal-plane and said plane is rotated toward a {100} crystal-plane.

5. The method of claim 1, wherein said device has a drive strength, said drive strength being a function of an angle between said first longitudinal axis and said second longitudinal axis.

6. The method of claim 1, wherein a mobility of inversion carriers along said first longitudinal axis is greater than a mobility of inversion carriers along said second longitudinal axis.

7. The method of claim 1, further including:
forming a single-crystal third fin from said single-crystal material, said third fin having first and second opposing ends and first and second opposing sidewalls and extending along said first longitudinal axis from said first to said second end of said third fin, said first end of said third fin in contact with said source and said second end of said third fin in contact with said drain;
forming said gate dielectric on said first and second sidewalls of said third fin; and
forming said conductive gate in contact with said gate dielectric formed on said first and second sidewalls of said third fin.

8. The method of claim 7, wherein said third fin is positioned between said first fin and said second fin.

9. A method for tuning the drive strength of an electronic device, comprising:
providing a source and a drain;
providing a single-crystal first fin having first and second opposing ends and first and second opposing sidewalls, said first end of said first fin in contact with said source and said second end of said first fin in contact with said drain;
providing a single-crystal second fin having first and second opposing ends and first and second opposing sidewalls, said first end of said second fin in contact with said source and said second end of said second fin in contact with said drain;
providing a first conductive gate in contact with a gate dielectric formed on said first and second sidewalls of said first fin and on said first sidewall of said second fin;
providing a second conductive gate in contact with a gate dielectric formed on said second sidewall of said second fin; and
connecting said first gate to a first voltage source at a first voltage level and connecting said second gate a second voltage source at a second voltage level, said first and second voltage levels being different.

10. The method of claim 9, wherein said first and second voltage levels have different magnitudes, different polarities or both different magnitudes and polarities.

11. The method of claim 9, where said drive strength is a function of a magnitude and polarity of said second voltage source.

12. The method of claim 9, wherein said source and said drain are doped N-type, said first fin and said second fin comprise intrinsic, lightly N-doped or P-doped mono-crystalline silicon and wherein said first and said second fins are aligned in a direction from respective said first ends of said first and said second fins to respective said second ends of said first and said second fins to a {100} crystal-plane.

13. The method of claim 9, wherein said source and said drain are doped P-type, said first fin and said second fin independently comprise intrinsic, N-doped or lightly P-doped mono-crystalline silicon and wherein said first and said second fins are aligned in a direction from respective said first ends of said first and said second fins respective said second ends of said first and said second fins to a {110} crystal-plane.

14. A method of tuning the drive strength ratio between a first transistor and a second transistor in an integrated circuit, comprising:
providing said transistor, said first transistor comprising:
a first source and a first drain;
a single-crystal first fin having first and second opposing ends and first and second opposing sidewalls, said first end of said first fin in contact with said first source and said second end of said first fin in contact with said first drain;
a single-crystal second fin having first and second opposing ends and first and second opposing sidewalls, said first end of said second fin in contact with said first source and said second end of said second fin in contact with said first drain;
a first conductive gate in contact with a gate dielectric formed on said first and second sidewalls of said first fin and on said first sidewall of said second fin; and
a second conductive gate in contact with a gate dielectric formed on said second sidewall of said second fin;
providing said second transistor, said second transistor comprising:
a second source and a second drain;
a single-crystal third fin having first and second opposing ends and first and second opposing sidewalls, said first end of said third fin in contact with said second source and said second end of said third fin in contact with said second drain; and
a third conductive gate in contact with a gate dielectric formed on said first and second sidewalls of said third fin and on said first and second sidewall of said third fin; and
connecting said first gate to a first voltage source at a first voltage level and connecting said second gate to a second voltage source at a second voltage level, said first and second voltage levels being different.

15. The method of claim 14, wherein said first and second voltage levels have different magnitudes, different polarities or both different magnitudes and polarities.

16. The method of claim 14, where said drive strength is a function of a magnitude and polarity of said second voltage source.

17. The method of claim 14 wherein said first source and said first drain are doped N-type said second source and said second drain are doped P-type, said first fin and said second fin independently comprise intrinsic, lightly N-doped or P-doped mono-crystalline silicon and said third fin comprises intrinsic, N-doped or lightly P-doped mono-crystalline silicon.

18. The method of claim 17, wherein first and second fins are aligned in a direction from respective said first ends of said first and said second fins to respective said second ends of said first and said second fins to a {100} crystal-plane and said third fin is aligned in a direction from said first end to said second end of said third fin to a {110} crystal-plane.

19. The method of claim 14, wherein said first source and said first drain are doped P-type, said second source and said second drain are doped N-type, said first fins and said second fin independently comprise intrinsic, N-doped or lightly P-doped mono-crystalline silicon and said third fin comprises intrinsic, lightly N-doped or P-doped mono-crystalline silicon.

20. The method of claim 19, wherein first and second fins are aligned in a direction from respective said first ends of said first and said second fins to said second ends of said first and said second fins to a {110} crystal-plane and said third fin is aligned in a direction from said first end to said second end of said third fin to a {100} crystal-plane.

* * * * *